United States Patent [19]

Hsu et al.

[11] Patent Number: 5,472,897
[45] Date of Patent: Dec. 5, 1995

[54] METHOD FOR FABRICATING MOS DEVICE WITH REDUCED ANTI-PUNCHTHROUGH REGION

[75] Inventors: Chen-Chung Hsu, Taichung; Gary Hong, Hsinchu, both of Taiwan

[73] Assignee: United Microelectronics Corp., Hsinchu, Taiwan

[21] Appl. No.: 370,611

[22] Filed: Jan. 10, 1995

[51] Int. Cl.$^6$ ................................................. H01L 21/336
[52] U.S. Cl. ............................. 437/44; 437/45; 437/162; 257/344
[58] Field of Search ............................. 437/41, 44, 45, 437/162; 257/336, 344, 402

[56] References Cited

U.S. PATENT DOCUMENTS

| | | | |
|---|---|---|---|
| 5,073,512 | 12/1991 | Yoshino | 437/41 |
| 5,141,891 | 8/1992 | Arima et al. | 437/45 |
| 5,175,118 | 12/1992 | Yoneda | 437/162 |
| 5,196,357 | 3/1993 | Boardman et al. | 437/44 |
| 5,219,777 | 6/1993 | Kang | 437/45 |
| 5,231,038 | 7/1993 | Yamaguchi et al. | 437/45 |
| 5,270,232 | 12/1993 | Kimura et al. | 437/41 |
| 5,270,234 | 12/1993 | Huang et al. | 437/45 |
| 5,372,960 | 12/1994 | Davies et al. | 437/45 |
| 5,374,574 | 12/1994 | Kwon | 437/45 |
| 5,374,575 | 12/1994 | Kim et al. | 437/44 |
| 5,399,508 | 3/1995 | Nowak | 437/44 |

FOREIGN PATENT DOCUMENTS 53-141585  12/1978  Japan ................................ 437/45

*Primary Examiner*—Mary Wilczewski
*Attorney, Agent, or Firm*—Ladas & Parry

[57] ABSTRACT

A method of fabricating MOS device with anti-punchthrough region is described. The area of anti-punchthrough region is reduced by using the control of double spacers. Moreover, this method utilizes the buried contact structure to connect to the source/drain regions, which not only reduces the contact resistance but also reduces the device size since the metal contact can be provided over the field oxide layer instead of the source/drain regions. Hence, this method is capable of fabricating submicron devices for semiconductor integrated circuit.

13 Claims, 4 Drawing Sheets

METHOD FOR FABRICATING MOS DEVICE WITH REDUCED ANTI-PUNCHTHROUGH REGION

BACKGROUND OF THE INVENTION

1. Field of the Invention

This invention relates in general to the fabrication of integrated circuit (IC) devices, and more particularly to a method for fabricating metal oxide silicon (MOS) devices with reduced anti-punchthrough regions for use in connection with scaled-down manufacture process.

2. Description of the Prior Art

In submicron sized transistors, hot electron injection into the gate of such transistors is a serious reliability problem. Structures have been proposed to overcome this problem in the attempt to design a high speed very large scale integration (VLSI) manufacturable submicron MOS transistor which exhibits resistance to hot electron degradation.

One such device is a MOS device with anti-punchthrough region. The fabrication process for making this device will be better understood from the following detailed description by referring to FIGS. 1A to 1C.

As shown in FIG. 1A, a field oxide layer 11 is formed by the conventional local oxidation of silicon (LOCOS) process to define an active area on a P type silicon substrate 10. A pad oxide layer 12 and a silicon nitride layer 13 are sequentially formed by chemical vapor deposition (CVD) on the silicon substrate 10. The pad oxide layer 12 and the silicon nitride layer 13 are patterned by conventional lithography and etching processes to form an opening 8 which exposes the area of the silicon substrate 10 that will form a gate electrode. A $P^+$ anti-punchthrough region 14 is then formed by implanted boron ions through the opening 8 into the silicon substrate 10.

Turning now to Fig. 1B, a gate oxide layer 15 is formed on portion of the silicon substrate 10 within the opening 8. A polysilicon layer 16 is deposited by CVD overlying the gate oxide layer 15 and the silicon nitride layer 13. Next, the portion of the polysilicon layer 16 over the silicon nitride layer 13 is removed, such as by chemical mechanical polishing (CMP), so as to provide a generally planar surface, as is shown in FIG. 1C. The remaining portion of the polysilicon layer 16 within the opening 8 forms a polysilicon gate 16a. The gate oxide layer 15 and the polysilicon gate 16a together define a gate electrode.

The silicon nitride layer 13 and the pad oxide layer 12 are then removed by etching. N type impurities, such as phosphorous ions, are implanted into the P type silicon substrate 10 to form $N^-$ lightly doped source/drain regions 18 by using the polysilicon gate 16a as a mask. Next, a sidewall spacer 17 is formed on each the sidewall of gate electrode, i.e., the polysilicon gate 16a and the gate oxide layer 15, by deposition and an etching back process well known in the art. Finally, N type impurities, such as arsenic ions, are implanted into the P type silicon substrate 10 to form $N^+$ heavily doped source/drain regions 19 by using the polysilicon gate 16a and the sidewall spacers 17 as a mask, completing the fabrication of prior art MOS device.

The above prior art MOS device uses a $P^+$ anti-punchthrough region 14 formed beneath the gate electrode and between the source/drain regions to prevent the hot electron effect, thereby improving the device reliability. However, with the continued reduction of the size of devices, the relatively high contact resistance of the source/drain regions becomes a major drawback when applying this technique to submicron processes. In addition, due to the limitation in the configuration of the prior art device, the process step of forming metal contacts should be performed in the area above the $N^+$ heavily doped source/drain regions 19. Therefore, it is difficult to make further reductions in the size of the device.

It is therefore an object of the present invention to provide a method for fabricating MOS device capable of preventing the hot electron effect and reducing the contact resistance of the source/drain regions.

It is another object of the present invention to provide a method for fabricating MOS device, which can significantly reduce the device size so that it is suitable for use in submicron processes.

SUMMARY OF THE INVENTION

In accordance with the objects of this invention, a method of fabricating MOS device with anti-punchthrough region is described. The method comprises the step of: providing a semiconductor substrate of a first conductivity type which has a device isolation layer formed therein; sequentially forming a first conducting layer and a barrier layer on the semiconductor substrate; patterning the barrier layer to form an opening; forming a first sidewall spacer on the sidewall of the barrier layer; etching portion of the first conducting layer not covered by the barrier layer and the first sidewall spacer to expose the area of the semiconductor substrate that will form a gate electrode; forming a second sidewall spacer on the sidewall of the first sidewall spacer and the first conducting layer; implanting impurities of the first conductivity type through the opening into the semiconductor substrate to form an anti-punchthrough region; forming a gate oxide layer on the surface of the semiconductor substrate within the opening; forming a second conducting layer overlying the barrier layer, the first sidewall spacer, the second sidewall spacer, and the gate oxide layer; etching portion of the second conducting layer over the barrier layer, thereby the remained portion of the second conducting layer within the opening forms a gate; removing the barrier layer; implanting impurities of a second conductivity type into the first conducting layer and the gate, wherein portion of the impurities of the second conductivity type being diffused into the semiconductor substrate to form both heavily doped source/drain regions under the first conducting layer and lightly doped source/drain regions under the second sidewall spacer simultaneously; forming a dielectric layer overlying the whole surface of the semiconductor substrate; and forming metal contacts in the dielectric layer, completing the fabrication of the MOS device.

The area of the anti-punchthrough region is reduced in size by control of double spacers. Moreover, this method utilizes a buried contact structure to connect to the source/drain regions, which not only reduces the contact resistance, but also reduces the size of the device since the metal contact can be formed over the field oxide layer instead of over the source/drain regions. This method is suitable for fabricating submicron size devices in semiconductor integrated circuits.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

Figure 1A:
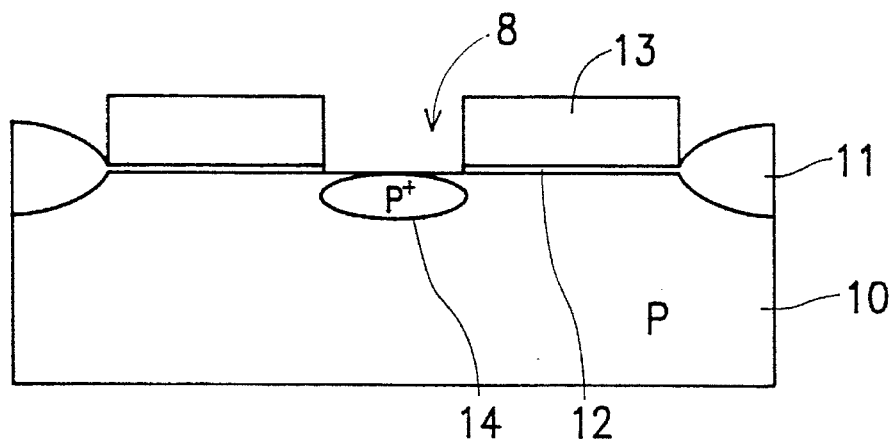
FIGS. 1A to 1C illustrate, in cross sectional views, the process steps for fabricating a prior art MOS device with an anti-punchthrough region.
Figure 1B:
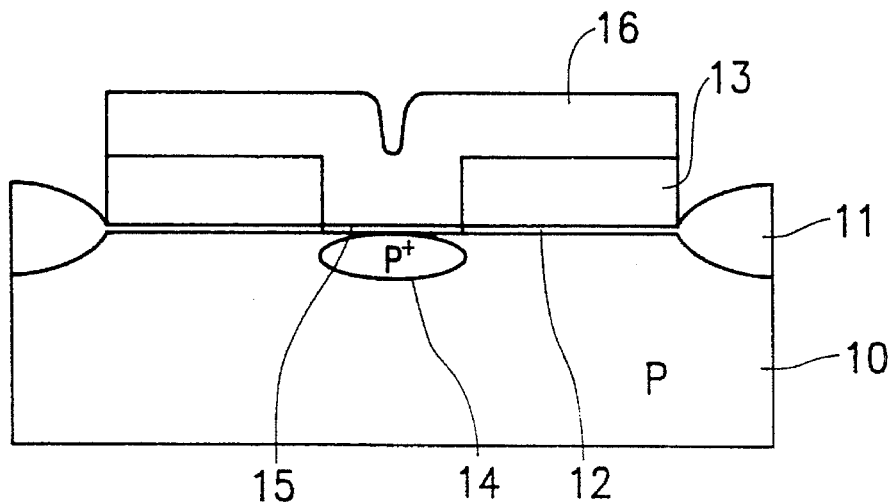
Figure 1C:
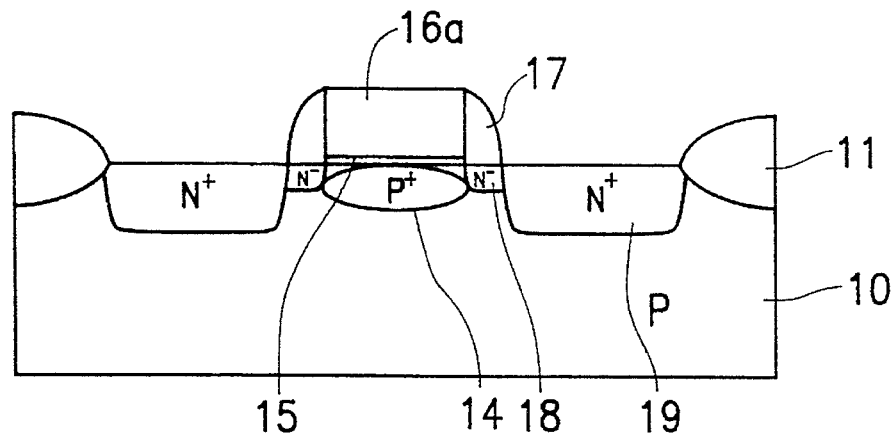
Figure 2A:
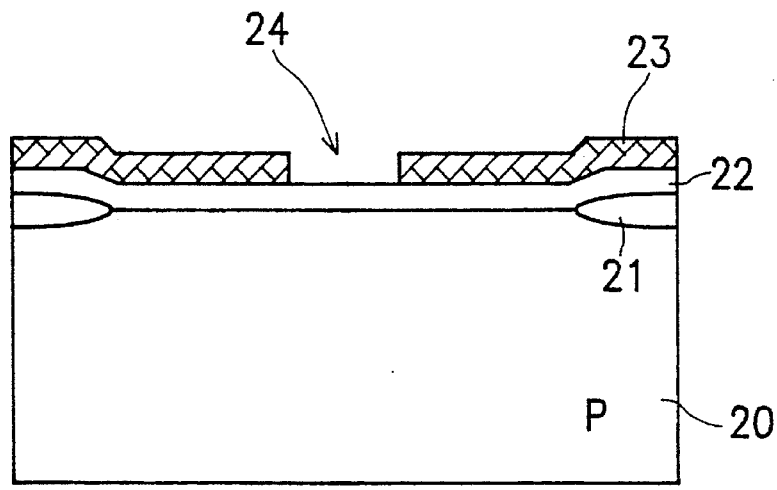
FIGS. 2A to 2H illustrate, in cross sectional views, the process steps for fabricating a MOS device with reduced anti-punchthrough region according to a first preferred embodiment of the present invention.

Referring to FIG. 2A, there is shown a semiconductor substrate of a first conductivity type, such as a P type silicon substrate 20. A field oxide layer 21 is formed, for the purpose of device isolation, on the silicon substrate 20 by the conventional LOCOS process. A first conducting layer, such as a first polysilicon layer 22, is formed on the silicon substrate 20, preferably by CVD. A barrier layer, such as a silicon nitride layer 23, is formed on the first polysilicon layer 22, preferably by CVD and then it is patterned by conventional lithography and etching techniques to form an opening 24.

Figure 2B:
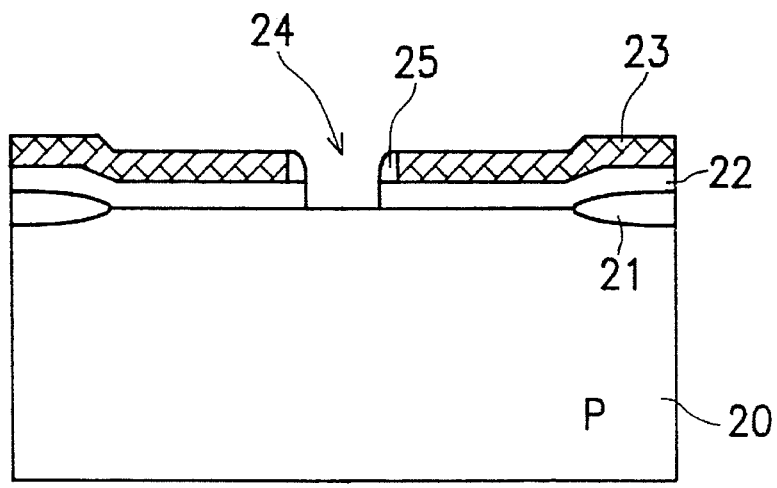

Referring to FIG. 2B, a first silicon dioxide layer is deposited on the exposed surfaces of the silicon nitride layer 23 and the first polysilicon layer 22. The first silicon dioxide layer is then anisotropically etched back, for example, by reactive ion etching (RIE), to form a first sidewall spacer 25 on the sidewall of the silicon nitride layer 23. A portion of the first polysilicon layer 22 not covered by the silicon nitride layer 23 and the first sidewall spacer 25 is removed preferably by RIE to expose the area of the semiconductor substrate 20 that will form a gate electrode.

Figure 2C:
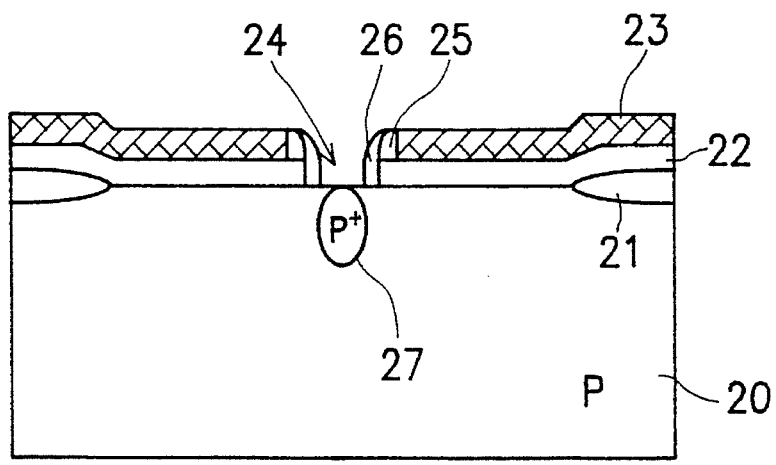

Turning now to FIG. 2C, by using the above mentioned deposition and etching back process steps, a second sidewall spacer 26 is similarly formed on the sidewall of the first sidewall spacer 25 and the first polysilicon layer 22 in the same manner. Impurities of the first conductivity type, such as P type boron ions with an implanting energy preferably of about 150 KeV and a dosage of about $1 \times 10^{12}$ atoms/cm$^2$, are implanted through the opening 24 into the silicon substrate 20 to form a P$^+$ anti-punchthrough region 27. By controlling the thicknesses of double spacers 25 and 26, the area of P$^+$ anti-punchthrough region 27 is controlled and can be reduced as desired.

Figure 2D:
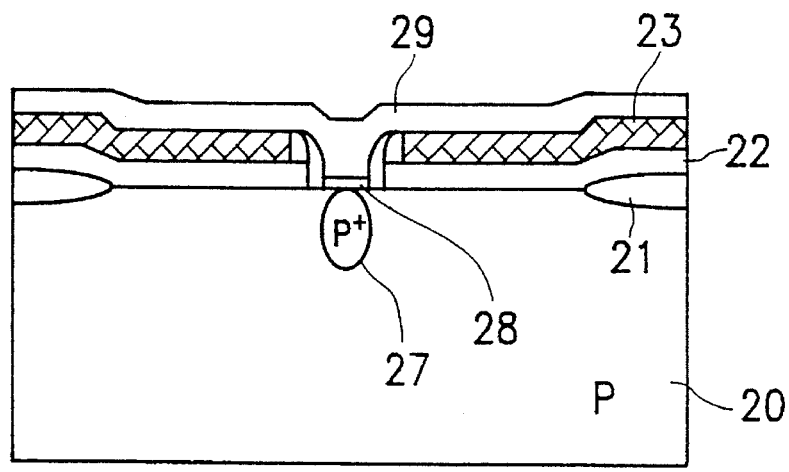
Figure 2E:
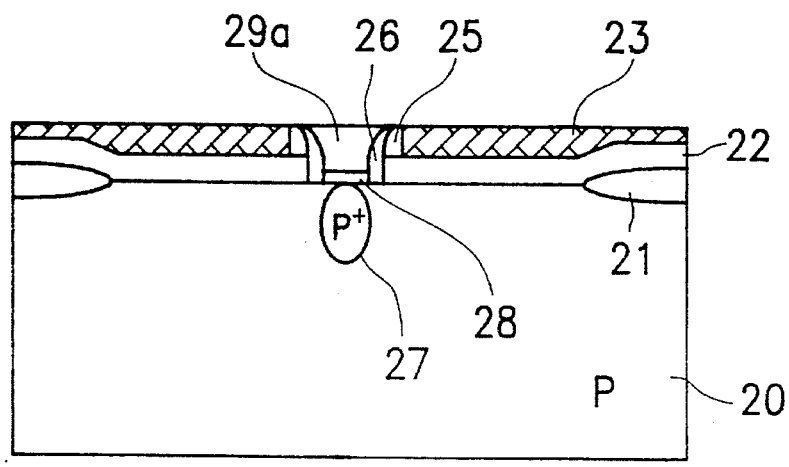

Referring to FIG. 2D, a gate oxide layer 28 with a thickness preferably between 50 Å to 100 Å is formed on the surface of the silicon substrate 20 within the opening 24 by thermal oxidation or CVD. A second conducting layer, such as a second polysilicon layer 29, is deposited overlying the silicon nitride layer 23, the first and second sidewall spacers 25 and 26, and the gate oxide layer 28. Then, portion of the second polysilicon layer 29 over the silicon nitride layer 23 is removed, preferably by CMP, to form a relatively planar surface, as is shown in FIG. 2E. Thereby, the remaining portion of the second polysilicon layer 29 within the opening 24 forms a polysilicon gate 29a.

Figure 2F:
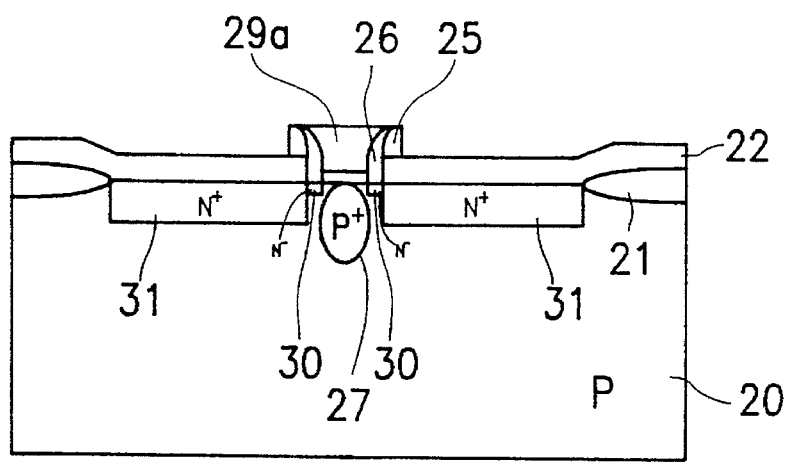

As can be seen by reference to FIG. 2F, the silicon nitride layer 23 is etched away using an appropriate solvent, such as a hot phosphoric acid solution. Impurities of a second conductivity type, such as N type arsenic or phosphoric ions, with an implanting energy of about 80 KeV and a dosage of between $1 \times 10^{15}$ to $8 \times 10^{15}$ atoms/cm$^2$, are implanted into the first polysilicon layer 22 and the polysilicon gate 29a.

Accordingly, a portion of the N type arsenic or phosphoric ions are diffused into the silicon substrate 20 to form simultaneously two N$^+$ heavily doped source/drain regions 31 under the first polysilicon layer 22 and two N$^-$ lightly doped source/drain regions 30 under the second sidewall spacer 26. With this buried contact structure, the first polysilicon layer 22 is electrically connected to the lightly and heavily doped source/drain regions 30 and 31.

Figure 2G:
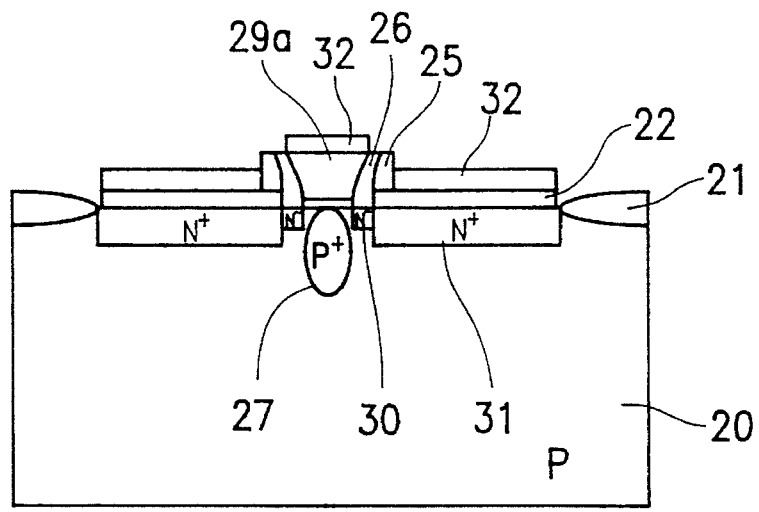
Figure 2H:
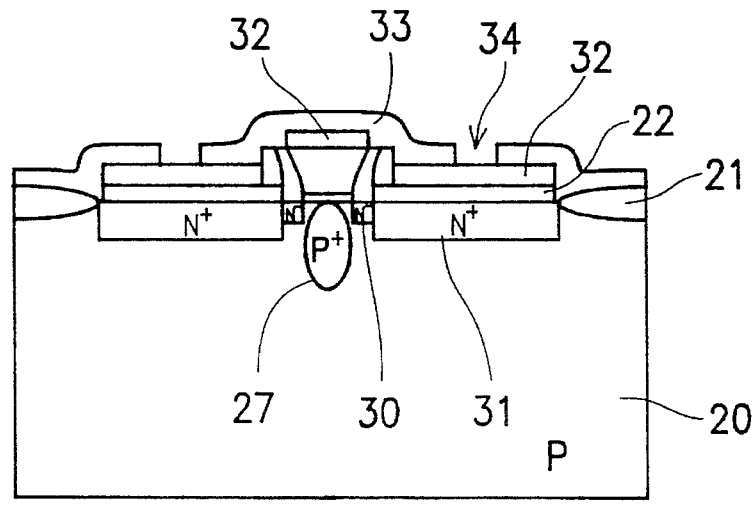
Figure 3:
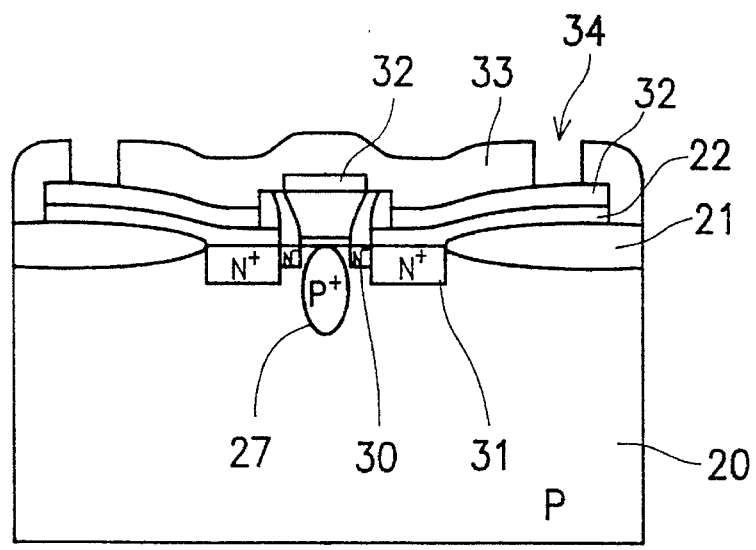
FIG. 3 shows in cross sectional view a MOS device with reduced anti-punchthrough region according to a second preferred embodiment of the present invention.

Referring now to FIG. 2G, the first polysilicon layer 22 is patterned by conventional lithography and etching process. Depending on the design rule, the remaining first polysilicon layer 22 can either cover the active area between the field oxide layer 21, as is shown in FIG. 2G, or even cover a part of the field oxide layer 21, as is shown in FIG. 3. An optional step of forming a metal silicide layer is performed to improve the conductivity of the polysilicon gate 29a and the first polysilicon layer 22. For example, a titanium silicide layer 32 is deposited overlying the surface of the polysilicon gate 29a and the first polysilicon layer 22. In completing the fabrication of the device, a dielectric layer 33, such as a layer made of silicon dioxide, polyimide, or borophosphosilicate glass, is deposited overlying the whole surface of the semiconductor substrate. Finally, metal contacts 34 are formed in the dielectric layer 33 by conventional lithography and etching process. With the use this disclosed buried contact process, the metal contacts 34 can be formed either in the dielectric layer 33 over the N$^+$ heavily doped source/drain regions 31, as is shown in FIG. 2H, or alternatively in the dielectric layer 33 over the field oxide layer 21, as is shown in FIG. 3. As such, the method of fabricating MOS devices according to the present invention will significantly reduce the size of those devices.

While the invention has been described by way of examples and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating MOS device, comprising the steps of:

providing a semiconductor substrate of a first conductivity type which has a device isolation layer formed thereon;

sequentially forming a first conducting layer and a barrier layer on said semiconductor substrate;

patterning said barrier layer to form an opening;

forming first sidewall spacers on the sidewalls of said barrier layer;

etching a portion of said first conducting layer not covered by said barrier layer and said first sidewall spacer to expose an area of said semiconductor substrate which will subsequently define a gate region;

forming second sidewall spacers on sidewalls of said first sidewall spacers and on said first conducting layer;

implanting impurities of the first conductivity type through an opening defined between said second sidewall spacers and into said semiconductor substrate to form an anti-punchthrough region therein;

forming a gate oxide layer on the surface of said semiconductor substrate between said second sidewall spacers;

forming a second conducting layer overlying said barrier layer, said first sidewall spacer, said second sidewall spacer, and said gate oxide layer;

etching a portion of said second conducting layer over said barrier layer, whereby the remaining portion of said second conducting layer within said opening forms a gate;

removing said barrier layer;

implanting impurities of a second conductivity type into said first conducting layer and said gate, wherein said impurities of the second conductivity type diffuse into said semiconductor substrate to form both heavily doped source/drain regions under said first conducting layer and lightly doped source/drain regions under said second sidewall spacers simultaneously;

forming a dielectric layer overlying the whole surface of said semiconductor substrate; and forming metal contacts in said dielectric layer.

2. The method of claim 1, wherein said first conducting layer is a polysilicon layer.

3. The method of claim 1, wherein said barrier layer is a silicon nitride layer.

4. The method of claim 1, wherein said first and second sidewall spacers comprise silicon dioxide.

5. The method of claim 1, wherein said impurities of the first conductivity type are boron ions with an implantation energy of about 150 KeV and a dosage of about $1 \times 10^{12}$ atoms/cm$^2$.

6. The method of claim 1, wherein said gate oxide layer has a thickness of between 50 Å to 100 Å.

7. The method of claim 1, wherein said second conducting layer is a polysilicon layer.

8. The method of claim 1, wherein said impurities of the second conductivity type are arsenic ions with an implantation energy of about 80 KeV and a dosage of between $1 \times 10^{15}$ to $8 \times 10^{15}$ atoms/cm$^2$.

9. The method of claim 1, wherein said dielectric layer is made of a material selected from the group consisting of silicon dioxide, polyimide, and borophosphosilicate glass.

10. The method of claim 1, wherein said metal contacts are formed in positions of said dielectric layer above said heavily doped source/drain regions.

11. The method of claim 1, wherein said metal contacts are formed in positions of said dielectric layer above said device isolation layer.

12. The method of claim 1, wherein after patterning said first conducting layer a metal silicide layer is formed on said first conducting layer and said gate.

13. The method of claim 12, wherein said metal silicide layer is a titanium silicide layer.

* * * * *